US008503696B2

(12) United States Patent
Knutson et al.

(10) Patent No.: US 8,503,696 B2
(45) Date of Patent: Aug. 6, 2013

(54) EQUALIZER INTERFACE FOR ELECTRONIC APPARATUS

(75) Inventors: Paul Gothard Knutson, Lawrenceville, NJ (US); Jun Li, Plainsboro, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 1235 days.

(21) Appl. No.: 12/085,135

(22) PCT Filed: Nov. 16, 2005

(86) PCT No.: PCT/US2005/041397
§ 371 (c)(1),
(2), (4) Date: May 16, 2008

(87) PCT Pub. No.: WO2007/058650
PCT Pub. Date: May 24, 2007

(65) Prior Publication Data
US 2009/0174823 A1    Jul. 9, 2009

(51) Int. Cl.
*H03G 5/00* (2006.01)
(52) U.S. Cl.
USPC .............. 381/98; 381/106; 381/109; 348/738
(58) Field of Classification Search
USPC ...................... 348/738; 381/60, 98, 106, 109
See application file for complete search history.

(56) References Cited

U.S. PATENT DOCUMENTS

| 4,271,398 A | 6/1981 | Higashi et al. |
| 4,706,294 A | 11/1987 | Ouchida |
| 5,046,105 A | 9/1991 | Bohn |
| 5,195,141 A | 3/1993 | Jang |
| 5,617,478 A | 4/1997 | Tagami et al. |
| 5,617,480 A | 4/1997 | Ballard et al. |
| 6,167,139 A | 12/2000 | Kim |
| 6,317,117 B1 | 11/2001 | Goff |
| 6,442,281 B2 | 8/2002 | Sato et al. |
| 6,548,749 B2 | 4/2003 | Suda |
| 6,661,900 B1 | 12/2003 | Allred et al. |

(Continued)

FOREIGN PATENT DOCUMENTS

| CA | 2112171 | 10/2003 |
| CN | 90105182 | 10/1993 |

(Continued)

OTHER PUBLICATIONS

Schultz, "A Simple, Effective, Inexpensive Approach to Receive and/or Transmit Audio Equalization," CQ Radio Amateur's Journal, vol. 44, No. 12, pp. 13-18, Dec. 1988.

(Continued)

*Primary Examiner* — Kimberly Rizkallah
*Assistant Examiner* — Errol Fernandes
(74) *Attorney, Agent, or Firm* — Robert D. Shedd; Reitseng Lin (57) ABSTRACT

An electronic apparatus such as an audio apparatus, television signal receiver, or other apparatus provides an equalizer interface that enables equalizer settings to be adjusted via acoustic user feedback. According to an exemplary embodiment, the electronic apparatus includes a sound generator for generating a first tone for a first frequency band. A processor enables a user to adjust a first volume level of the first tone. A memory stores the first volume level for the first frequency band. A volume controller applies the first volume level to output signals in the first frequency band.

19 Claims, 4 Drawing Sheets

U.S. PATENT DOCUMENTS

| | | |
|---|---|---|
| 6,931,139 B1 | 8/2005 | Rybicki et al. |
| 2002/0154775 A1 | 10/2002 | Yang |
| 2003/0035555 A1 | 2/2003 | King et al. |
| 2003/0103079 A1 | 6/2003 | Adatia et al. |
| 2003/0179891 A1 | 9/2003 | Rabinowitz et al. |
| 2003/0189881 A1 | 10/2003 | Patil et al. |
| 2005/0060049 A1 | 3/2005 | Nelson |
| 2005/0078838 A1* | 4/2005 | Simon .......................... 381/98 |

FOREIGN PATENT DOCUMENTS

| | | |
|---|---|---|
| CN | 189046 A | 7/1998 |
| EP | 0748124 | 12/1996 |
| JP | 55074228 | 6/1980 |
| JP | 62-237899 | 10/1987 |
| JP | 3-16725 | 2/1991 |
| JP | 03180895 A * | 8/1991 |
| JP | 7046216 | 2/1995 |
| JP | 7106877 | 4/1995 |
| JP | 10163778 | 6/1998 |
| JP | 2000-77960 | 3/2000 |
| JP | 2001-067100 A | 3/2001 |
| JP | 2005-117298 | 4/2005 |
| JP | 2005-309212 A | 11/2005 |
| KR | 20020045578 | 2/2002 |
| KR | 200118185 | 8/2006 |
| WO | WO2004054099 | 6/2004 |

OTHER PUBLICATIONS

Lee, "Digitally Controlled Equalizer Integrated Circuit," Elektronik, vol. 35, No. 17, pp. 83-86, 90-92, Aug. 22, 1986.

Reed, "A Perceptual Assistant to do Sound Equalization," University of Illinois at Chicago, reed@uic.edu.

International Search Report dated Oct. 11, 2006.

* cited by examiner

EQUALIZER INTERFACE FOR ELECTRONIC APPARATUS

This application claims the benefit, under 35 U.S.C. §365 of International Application PCT/US2005/04139, filed Nov. 16, 2005, which was published in accordance with PCT Article 21(2) on May 24, 2007, in English.

BACKGROUND OF THE INVENTION

1. Field of the Invention
2. Background Information

Figure 1:
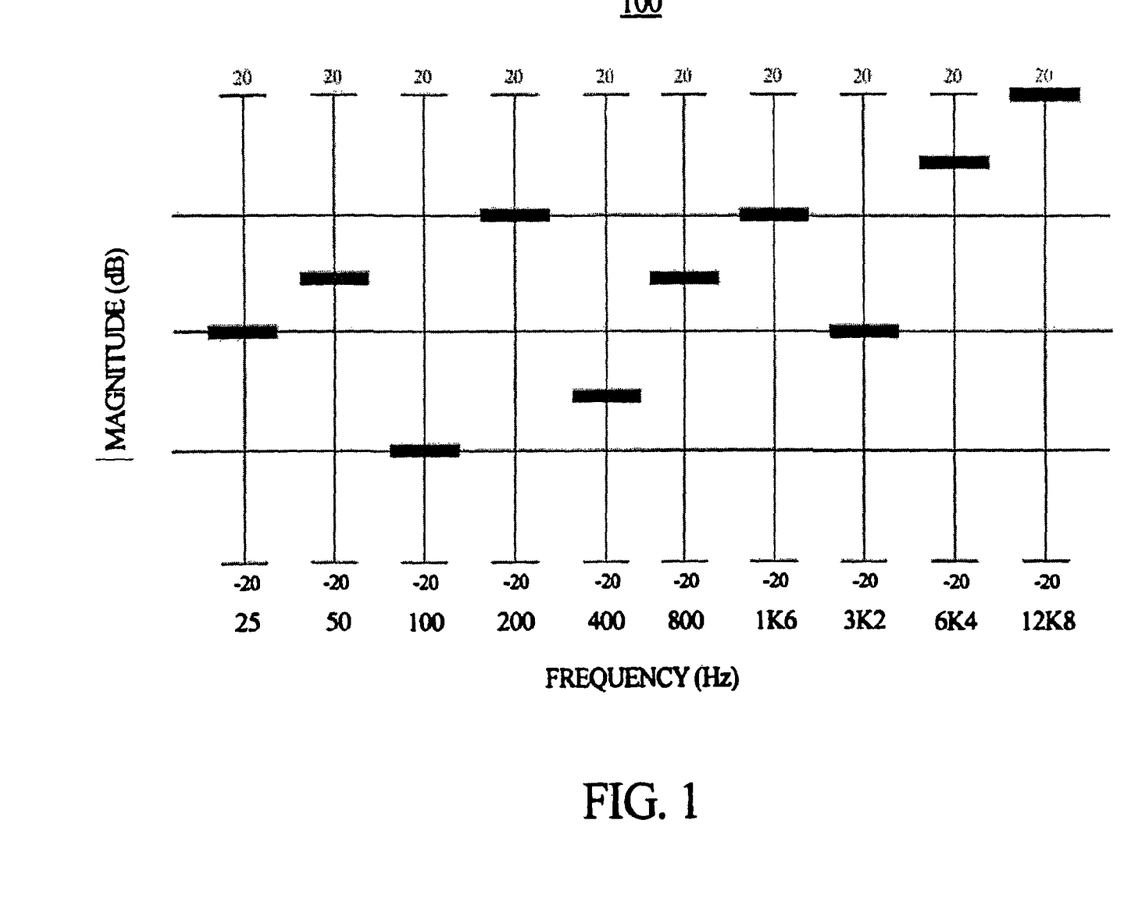
FIG. 1 is an exemplary equalizer interface according to conventional art.

Electronic apparatuses such as audio apparatuses, television signal receivers or other apparatuses may include an equalizer interface for presenting to users the equalizer settings that represent gain/attenuation levels of multiple frequency bands. Conventional equalizer interfaces are often presented to users via some sort of display screen (e.g., CRT screen, LCD screen, etc.) that enables users to visually observe the equalizer settings. Additionally, such conventional equalizer interfaces may include some sort of manual adjustment means (e.g., sliding potentiometers, etc.) that enables users to manually adjust equalizer settings by adjusting the gain/attenuation levels of the respective frequency bands. FIG. 1 shows an exemplary equalizer interface according to conventional art.

With relatively small electronic apparatuses (e.g., MP3 audio players, etc.), there may be neither a display screen nor the available room for a display screen in order to accommodate a conventional equalizer interface, as described above. Moreover, the cost of providing such a display screen may be prohibitive for certain applications and/or markets. Larger electronic apparatuses (e.g., televisions, etc.), on the other hand, may include a display screen sufficient to accommodate a conventional equalizer interface, but require that such display screen be operating in order to adjust the equalizer settings. This requirement, however, causes the display screen (e.g., CRT screen, LCD screen, etc.) to unnecessarily consume power, and therefore may not be an energy efficient option for providing an equalizer interface.

Accordingly, there is a need for an equalizer interface for an electronic apparatus that is capable of addressing the foregoing problems, and can thereby provide an equalizer interface without requiring the use of a display screen or other conventional adjustment means. The present invention addresses these and/or other issues.

SUMMARY OF THE INVENTION

In accordance with an aspect of the present invention, an electronic apparatus is disclosed. According to an exemplary embodiment, the electronic apparatus comprises generating means for generating a first tone for a first frequency band. Processing means enable a user to adjust a first volume level of the first tone. Memory means store the first volume level for the first frequency band. Volume control means applies the first volume level to output signals in the first frequency band.

In accordance with another aspect of the present invention, a method for providing an equalizer interface for an electronic apparatus is disclosed. According to an exemplary embodiment, the method comprises steps of generating a first tone for a first frequency band, enabling a user to adjust a first volume level of the first tone, storing the first volume level for the first frequency band, and applying the first volume level to output signals in the first frequency band.

In accordance with another aspect of the present invention, a television signal receiver is disclosed. According to an exemplary embodiment, the television signal receiver comprises a sound generator operative to generate a first tone for a first frequency band. A processor is operative to enable a user to adjust a first volume level of the first tone. A memory is operative to store the first volume level for the first frequency band. A volume controller is operative to apply the first volume level to output signals in the first frequency band.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DESCRIPTION OF THE PREFERRED EMBODIMENTS

Figure 2:
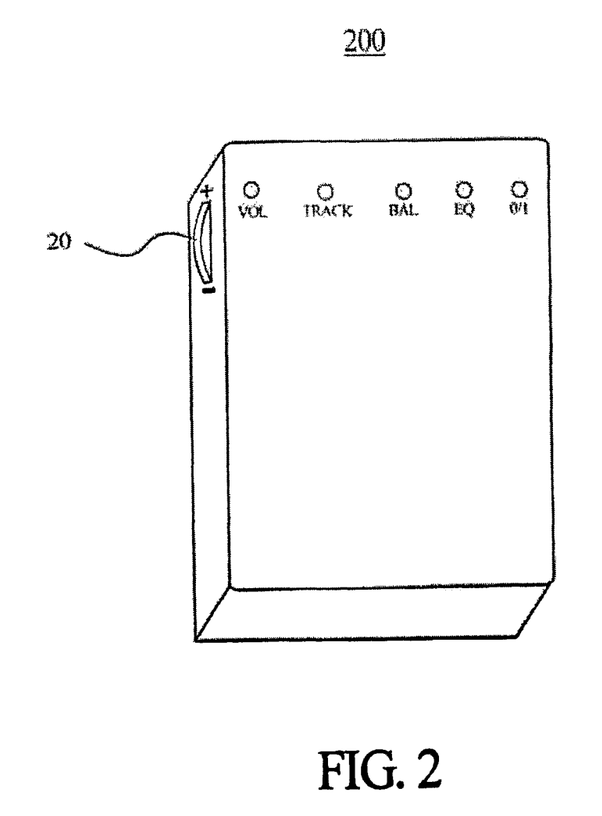
FIG. 2 is a diagram of an electronic apparatus having an equalizer interface according to an exemplary embodiment of the present invention.

Referring now to the drawings, and more particularly to FIG. 2, a diagram of an electronic apparatus 200 having an equalizer interface according to an exemplary embodiment of the present invention is shown. For purposes of example and explanation, electronic apparatus 200 of FIG. 2 is embodied as an audio apparatus such as an MP3 audio player or other type of audio apparatus that includes an equalizer function, but does not include a display screen. Accordingly, electronic apparatus 200 may not be capable of providing a conventional type of equalizer interface, such as the one shown in FIG. 1. However, electronic apparatus 200 may also be embodied as another type of apparatus such as a television signal receiver or other device that includes both an equalizer function and a display screen. In general, electronic apparatus 200 may be embodied as any type of apparatus having an equalizer function. As will be described later herein, the present invention provides an equalizer interface for an equalizer function that enables equalizer-settings to be adjusted via acoustic user feedback.

As shown in FIG. 2, exemplary electronic apparatus 200 comprises a plurality of buttons including a control button 20, a volume button ("VOL"), a track button ("TRACK"), a balance button ("BAL"), an equalizer button ("EQ"), and a power button ("0/1"). The latter five buttons may for example light up (e.g., via an LED, etc.) when activated. According to an exemplary embodiment, electronic apparatus 200 comprises at least two different modes of operation, including a normal mode and an equalizer adjustment mode. During the normal mode, electronic apparatus 200 operates in a normal manner and is thereby capable of receiving and outputting audio signals in a conventional manner. Also during the normal mode, a user may for example adjust the volume of audio output signals via the volume button ("VOL"), change audio tracks via the track button ("TRACK"), adjust the balance of right and left audio output signals via the balance button ("BAL"), and turn electronic apparatus 200 on and off via the power button ("0/1").

According to an exemplary embodiment, a user may switch electronic apparatus 200 from the normal mode to the equalizer adjustment mode via the equalizer button ("EQ"). During the equalizer adjustment mode, electronic apparatus 200 provides an equalizer interface for its equalizer function that enables equalizer settings to be adjusted via acoustic user feedback. As will be described later herein, the equalizer interface of the present invention enables the gain/attenuation (i.e., volume) levels of individual frequency bands to be adjusted independently via control button 20 without requiring the use of a display screen or other conventional adjustment means. In this manner, the equalizer interface of the present invention may advantageously avoid using a conventional type of equalizer interface, such as the one shown in FIG. 1. As a result, the equalizer interface of the present invention may be particularly suitable for relatively small electronic apparatuses (e.g., MP3 audio players, etc.) that lack the available room for a display screen or other type of conventional equalizer interface. Moreover, the equalizer interface of the present invention may also be suitable for larger electronic apparatuses that include a display screen (e.g., televisions, etc.), but would like to converse power by not requiring the use of such display screen to facilitate the adjustment of equalizer settings. Further exemplary details regarding the equalizer interface of the present invention will be provided later herein.

Figure 3:
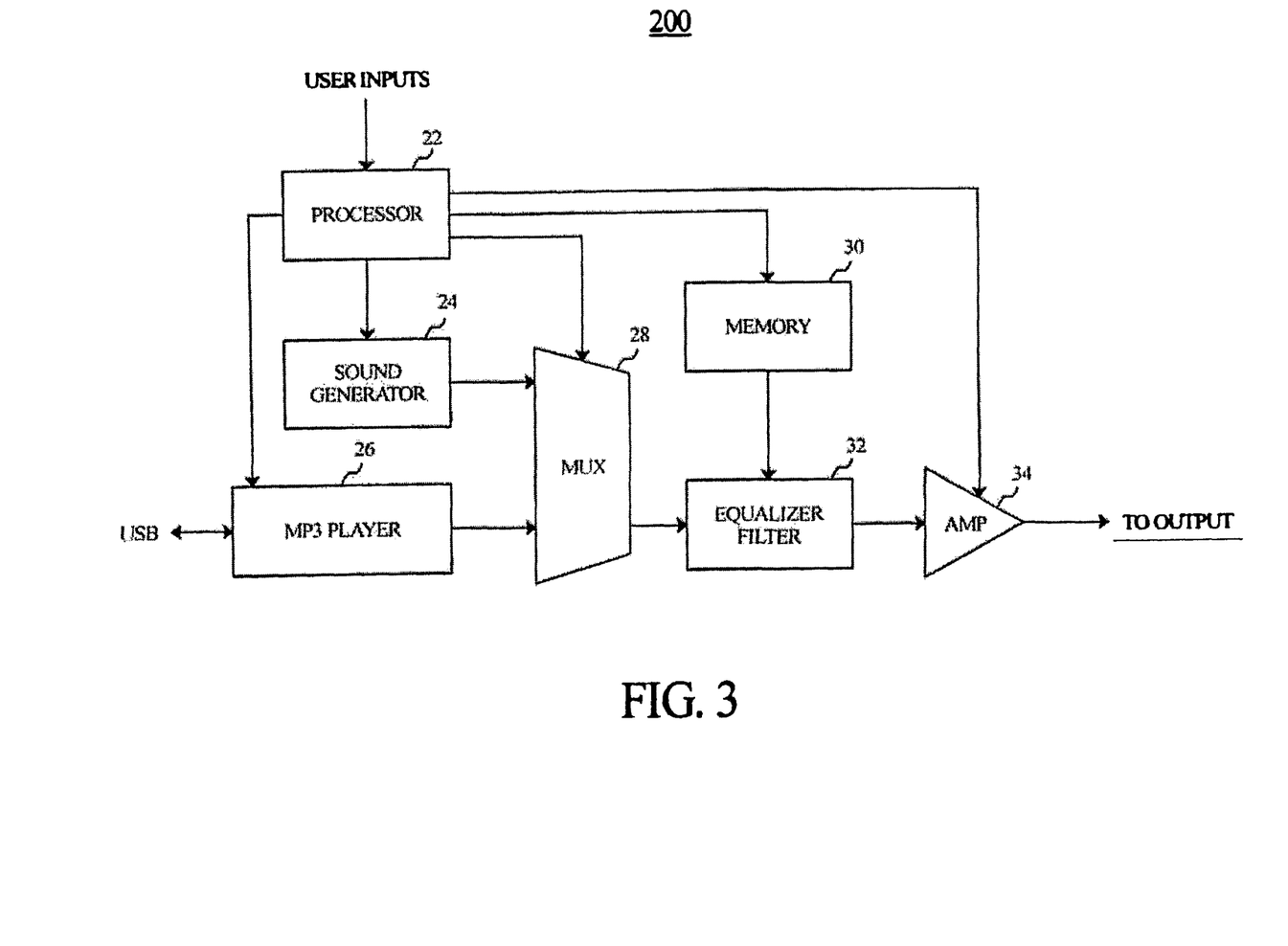
FIG. 3 is a block diagram providing further details of the electronic apparatus of FIG. 1 according to an exemplary embodiment of the present invention.

Referring to FIG. 3, a block diagram providing further details of electronic apparatus 200 of FIG. 2 according to an exemplary embodiment of the present invention is shown. As indicated in FIG. 3, electronic apparatus 200 comprises processing means such as processor 22, sound generating means such as sound generator 24, audio player means such as MP3 player block 26, multiplexing means such as multiplexer 28, memory means such as memory 30, volume control means such as equalizer filter 32, and amplifying means such as amplifier 34. Some of the foregoing elements of FIG. 3 may be embodied using integrated circuits (ICs), and some elements may for example be included on one or more ICs. For clarity of description, certain conventional elements associated with electronic apparatus 200 such as certain control signals, power signals and/or other elements may not be shown in FIG. 3.

Processor 22 is operative to provide various processing functions of electronic apparatus 200. According to an exemplary embodiment, processor 22 receives and processes user inputs to electronic apparatus 200 which enable the equalizer adjustment mode. As will be described later herein, processor 22 may provide control signals to various other elements of electronic apparatus 200 responsive to such user inputs.

Sound generator 24 is operative to generate various sounds including tones, clicks and/or voice synthesized sounds. According to an exemplary embodiment, sound generator 24 provides such sounds during the equalizer adjustment mode of electronic apparatus 200 responsive to control signals from processor 22, and is disabled during the normal mode.

MP3 player block 26 is operative to provide the functionality of a conventional MP3 audio player. In this manner, FIG. 3 illustrates how a conventional MP3 audio player may be modified to provide an equalizer interface that enables equalizer settings to be adjusted via acoustic user feedback in accordance with principles of the present invention. As indicated in FIG. 3, MP3 player block 26 may be operatively coupled to one or more external devices (e.g., computers, etc.) via a bus such as a universal serial bus (USB) and/or other coupling means.

Multiplexer 28 is operative to selectively output signals from either sound generator 24 or MP3 player block 26 in accordance with a control signal from processor 22. According to an exemplary embodiment, multiplexer 28 is switched to provide output signals from MP3 player block 26 during the normal mode, and is switched to provide output signals from sound generator 24 during the equalizer adjustment mode.

Memory 30 is operative to store data indicating the gain/attenuation settings for various different frequency bands. According to an exemplary embodiment, memory 30 stores various filter coefficient values that each correspond to a gain/attenuation level for a particular frequency band. As will be described later herein, a given gain/attenuation level corresponds to a different volume level.

Equalizer filter 32 is operative to perform band filtering for providing the equalizer function of electronic apparatus 200. Equalizer filter 32 may be implemented in a number of different ways including analog implementations (e.g., RC filter, etc.), and/or digital implementations. According to an exemplary embodiment, equalizer filter 32 performs such band filtering digitally using the filter coefficient values stored in memory 30, and a given filter coefficient value represents a gain/attenuation level for a particular band that is applied to the output of a band pass filter included in equalizer filter 32. According to another exemplary embodiment, a given filter coefficient value may represent a digital filter parameter, or a change in the desired frequency response of equalizer filter 32 where processor 22 may compute new coefficient values corresponding to the desired frequency response. As will be described later herein, equalizer settings for the equalizer function may be adjusted during the equalizer adjustment mode of electronic apparatus 200 via acoustic user feedback. Once the equalizer settings are established, equalizer filter 32 automatically applies these settings to audio output signals during the normal mode of operation to provide the equalizer function.

Amplifier 34 is operative to amplify the audio signals output from equalizer filter 32 in accordance with a control signal provided by processor 22. According to an exemplary embodiment, amplifier 34 is used to control the volume of audio output signals responsive to user inputs when electronic apparatus 200 is in the normal mode.

Figure 4:
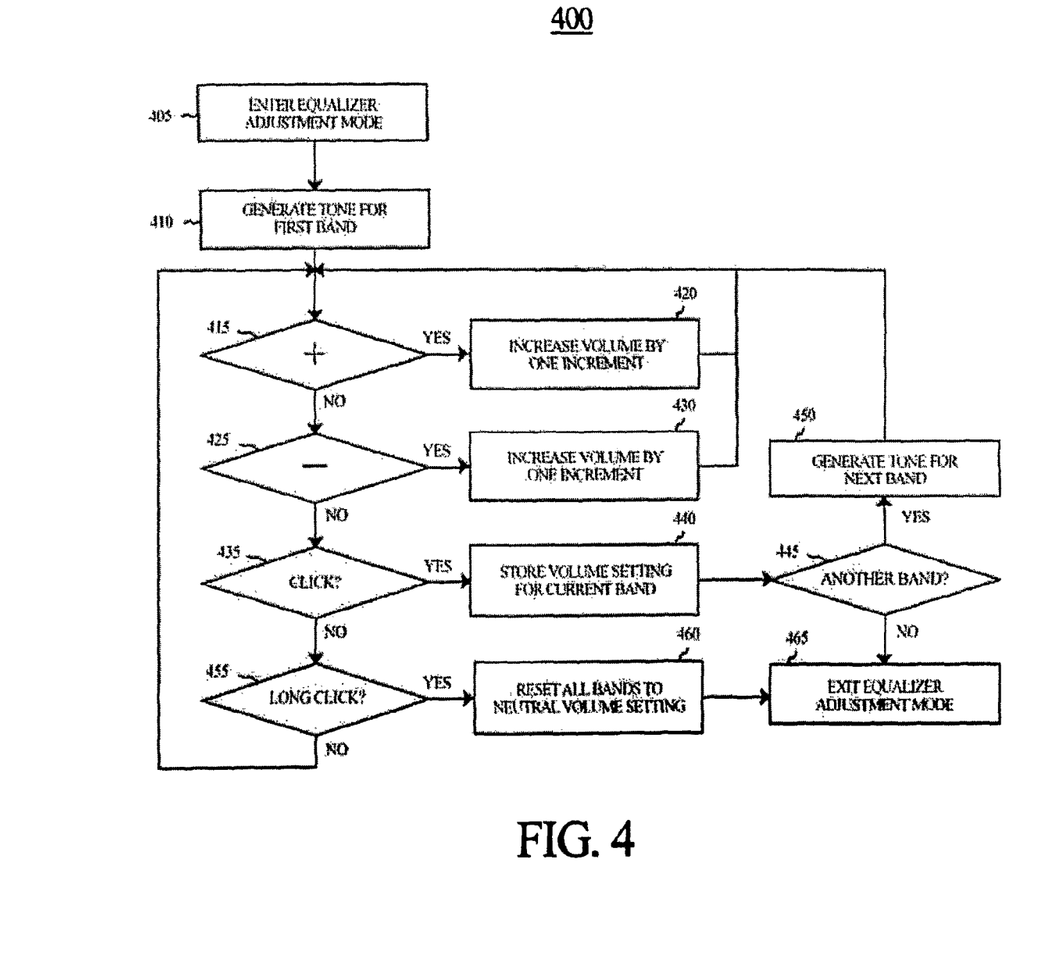
FIG. 4 is a flowchart illustrating steps for providing an equalizer interface for an electronic apparatus according to an exemplary embodiment of the present invention.

Referring now to FIG. 4, a flowchart 400 illustrating steps for providing an equalizer interface for an electronic apparatus according to an exemplary embodiment of the present invention is shown. For purposes of example and explanation, the steps of FIG. 4 will be described with reference to electronic apparatus 200 shown in FIGS. 2 and 3. The steps of FIG. 4 are exemplary only, and are not intended to limit the present invention in any manner.

At step 405, electronic apparatus 200 enters the equalizer adjustment mode. According to an exemplary embodiment, electronic apparatus 200 is switched from the normal mode to the equalizer adjustment mode in response to one or more predetermined user inputs. For example, electronic apparatus 200 may be switched from the normal mode to the equalizer adjustment mode at step 405 in response to a user pressing its equalizer button ("EQ") (see FIG. 2). Processor 22 detects the one or more predetermined user inputs, and in response thereto, outputs various control signals which cause electronic apparatus 20 to enter the equalizer adjustment mode at step 405.

According to an exemplary embodiment, processor 22 provides the following control signals to enter the equalizer adjustment mode at step 405: a control signal is provided to MP3 player block 26 which interrupts its operation and discontinues any audio signal output or reception, a control signal is provided to multiplexer 28 which switches its output path from MP3 player block 26 to sound generator 24, and a control signal is provided to sound generator 24 which initializes its operation. Alternatively, the MP3 player block 26 can continue to operate but its output can not reach the user because the multiplexer 28 has switched its input to the output of the sound generator 24.

Other functions may also be performed when electronic apparatus 200 enters the equalizer adjustment mode at step 405. For example, an LED included within or associated with equalizer button ("EQ") may light up to indicate to the user that electronic apparatus 200 has entered the equalizer adjustment mode.

At step 410, a tone is generated for a first frequency band. According to an exemplary embodiment, the control signal provided from processor 22 to sound generator 24 causes sound generator 24 to generate the tone for the first frequency band at step 410. The tone may for example be generated at step 410 as a burst of a predetermined duration at a predetermined volume level. For example, the tone may be generated at the stored setting for the first frequency band, which may be a neutral volume level (e.g., 0 dB magnitude), or the most recent volume level setting for the first frequency band. The tone burst may also include a relatively short click or beep at the beginning of its duration. Such clicks or beeps may enable the user to keep track of which frequency band is currently being generated and adjusted. The actual frequency band that corresponds to the first frequency band (and all other frequency bands referred to herein) is a matter of design choice. For example, the first frequency band may correspond to a frequency band having a center frequency of 25 Hz, as shown in FIG. 1. The first frequency band may also overlap an adjacent frequency band (i.e., the second frequency band) by a predetermined amount.

At step 415, the user may elect to upwardly adjust the volume level of the tone for the first frequency band. According to an exemplary embodiment, the user may manipulate (e.g., press, rotate, etc.) control button 20 of electronic apparatus 200 (see FIG. 2) in an upward direction at step 415 to thereby increase the volume level of the tone for the first frequency band. If the user manipulates control button 20 in the upward direction at step 415, process flow advances to step 420 where the volume level of the tone for the first frequency band is increased by one increment, which may be set as a matter of design choice. According to an exemplary embodiment, processor 22 enables the volume increase at step 420 by providing a control signal to memory 30 which causes a filter coefficient value corresponding to the increased volume level to be output to equalizer filter 32. This filter coefficient value may adjust the amount of attenuation/gain applied to the tone by equalizer filter 32, thereby increasing its volume.

At step 425, the user may elect to downwardly adjust the volume level of the tone for the first frequency band. According to an exemplary embodiment, the user may manipulate (e.g., press, rotate, etc.) control button 20 of electronic apparatus 200 (see FIG. 2) in a downward direction at step 425 to thereby decrease the volume level of the tone for the first frequency band. If the user manipulates control button 20 in the downward direction at step 425, process flow advances to step 430 where the volume level of the tone for the first frequency band is decreased by one increment, which may be set as a matter of design choice. According to an exemplary embodiment, processor 22 enables the volume decrease at step 430 by providing a control signal to memory 30 which causes a filter coefficient value corresponding to the decreased volume level to be output to equalizer filter 32. This filter coefficient value may adjust the amount of attenuation/gain applied to the tone by equalizer filter 32, thereby decreasing its volume.

As indicated in FIG. 4, steps 415 to 430 may be repeatedly performed as the user elects to upwardly and/or downwardly adjust the volume level of the tone for the first frequency band. Once the user has selected a desired volume level for the tone of the first frequency band, process flow advances to step 435 where the user may set that desired volume level for the tone of the first frequency band by clicking (e.g., pressing inwardly) control button 20 of electronic apparatus 200 for a first predetermined length of time, which for example is less than a second. If the user clicks control button 20 at step 435, process flow advances to step 440 where the desired volume level setting is stored in memory 30 under the control of processor 22. According to an exemplary embodiment, equalizer filter 32 automatically applies this desired volume level setting to output signals in the first frequency band during the normal mode of operation to provide the equalizer function.

From step 440, process flow advances to step 445 where the user may elect to adjust the volume level for another frequency band, assuming another frequency band exists. If another frequency band exists and the user elects to adjust the volume level for another frequency band at step 445, process flow advances to step 450 where processor 22 provides a control signal which causes sound generator 24 to generate a tone for the next sequential frequency band. For example, the next (e.g., second) frequency band may correspond to a frequency band having a center frequency of 50 Hz, as shown in FIG. 1. The user may also elect to skip one or more or the remaining frequency bands (e.g., skip from the first frequency band to the third or other frequency band, etc.) at step 445 by providing one or more predetermined inputs (e.g., clicking control button 20 as described in step 435) to electronic apparatus 200. When the user elects to skip one or more frequency bands at step 445, process flow advances to step 450 where sound generator 24 generates a tone for the next applicable frequency band. Individual tones may be generated at step 450 as a burst of a predetermined duration at a predetermined volume level in a similar manner as described above with reference to step 410. Such tone bursts may also include a relatively short click or beep at the beginning of their duration so that users may keep track of which frequency band is currently being generated and adjusted.

From step 450, process flow loops back to step 415 where the user may elect to upwardly adjust the volume level of the tone for the next frequency band. Process flow may then repeat itself a number of times in the manner previously described above, and as shown in FIG. 4. In this manner, the user may sequentially and independently adjust the volume levels for all frequency bands associated with the equalizer function of electronic apparatus 200. The number of frequency bands associated with the equalizer function and the specific frequency bands selected for such frequency bands is a matter of design choice. For example, the equalizer function of electronic apparatus 200 may include ten different frequency bands having center frequencies as shown in FIG. 1. Such frequency bands may also overlap adjacent frequency bands by a predetermined amount.

Referring back to step 445, if the user elects not to adjust the volume level for another frequency band, or if no other frequency bands exist, process flow advances to step 465 where electronic apparatus 200 exits the equalizer adjustment mode, as will be described later herein. The user may for example elect not to adjust the volume level for another frequency band at step 445 by providing a predetermined input (e.g., press equalizer button ("EQ"), etc.) to electronic apparatus 200.

Referring to step 455, the user may also elect to clear all equalizer settings by providing a user control signal. According to an exemplary embodiment, the user may provide the user control signal as a long click on the control button 20 at step 455 by pressing in control key 20 for a second predetermined length of time, for example 3 seconds or more, which is longer in duration than the click of the first predetermined length of time described in step 435. If the user provides a long click at step 455, process flow advances to step 460 where all of the equalizer settings are cleared to neutral volume settings. For example, the volume settings for all frequency bands associated with the equalizer function may be set to 0 dB attenuation/gain or another predetermined level.

Furthermore, although not shown in the flow chart, after the user has selected a volume setting at step 435, the user may be able to select the volume setting as the neutral volume setting for that frequency band by providing another user control signal, for example, clicking the control button 20 for a third predetermined length of time, for example 2 seconds, which is longer than the first predetermined interval of time but shorter than the second predetermined interval of time. In effect, a neutral volume setting for a frequency band may differ from that of another frequency band.

From step 460, process flow advances to step 465 where electronic apparatus 200 exits the equalizer adjustment mode. According to an exemplary embodiment, processor 22 provides the following control signals to exit the equalizer adjustment mode at step 460: a control signal is provided to MP3 player block 26 which re-enables its operations for audio signal output or reception, a control signal is provided to multiplexer 28 which switches its output path from sound generator 24 back to MP3 player block 26, and a control signal is provided to sound generator 24 which disables its operation. Other functions may also be performed when electronic apparatus 200 exits the equalizer adjustment mode at step 460. For example, an LED included within or associated with equalizer button ("EQ") may be turned off to indicate to the user that electronic apparatus 200 has exited the equalizer adjustment mode.

In another embodiment, pressing the EQ key during an equalizer adjustment mode causes the electronics apparatus 200 to exit the equalizer adjustment mode.

Variations of the foregoing steps of FIG. 4 are also within the scope of the present invention. For example, tone generator 24 may provide voice-synthesized messages during the equalizer adjustment mode to indicate, for example, the particular frequency band currently being adjusted and/or the current settings for each frequency band. Also, during the equalizer adjustment mode, audio signals from MP3 player block 26 could still be output (e.g., as background music) as the user adjusts the equalizer settings. To provide this functionality, multiplexer 28 could be replaced with a signal mixer to enable output of audio signals from both sound generator 24 and MP3 player block 26. In this embodiment, the settings for the audio signals from the MP3 player block 26 are not changed during the adjustment. The new settings take effect when the electronic apparatus 200 has exited the equalizer adjustment mode. Other variations may also be provided in accordance with the principles of the present invention.

As described above, the present invention provides an equalizer interface for an electronic apparatus that enables equalizer settings to be adjusted via acoustic user feedback. The present invention may be applicable to various apparatuses, either with or without an integrated display device. Accordingly, the phrases "electronic apparatus" or "television signal receiver" as used herein may refer to systems or apparatuses including, but not limited to, television sets, computers or monitors that include an integrated display device, and systems or apparatuses such as set-top boxes, video cassette recorders (VCRs), digital versatile disk (DVD) players, video game boxes, personal video recorders (PVRs), computers or other apparatuses that may not include an integrated display device.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. An electronic apparatus having an adjustment mode and a normal operating mode, comprising:
 a control button for a user to provide a first command to select a first one of a plurality of tones corresponding to different frequency bands, wherein said plurality of tones are selected in a predefined sequential manner, such that if another occurrence of said first command is provided immediately after said first command, a second tone, which is the immediately next tone in sequence, is selected, and said control button also allows a user to provide a second command, such that if a second command is received immediately after said first command, a third tone, which is a tone in sequence after said second tone, is selected;
 generating means for generating said first and third tones respectively responsive to said first and second commands in said adjustment mode;
 processing means for placing said electronic apparatus in one of said adjustment mode and said normal operating mode responsive to a mode signal in said adjustment mode and for enabling a user to adjust a first volume level of said first tone and a second volume level of said third tone;
 memory means for storing said first and second volume levels respectively for first and third frequency bands respectively corresponding to said first and third tones; and
 volume control means having first and second filters for receiving signals from said generating means in said adjustment mode or from a sound player in said normal operating mode, said volume control means respectively applying said first and second volume levels stored in said memory means to output signals from said first and second filters,
 wherein said electronic apparatus does not provide a visual output representative of the frequency bands.

2. The electronic apparatus of claim 1, wherein:
 said generating means generates a plurality of additional tones for a corresponding plurality of additional frequency bands;
 said processing means enables said user to adjust volume levels of said additional tones;
 said memory means stores said volume levels for said additional frequency bands; and said volume control means applies said volume levels to output signals from corresponding filters in said additional frequency bands.

3. The electronic apparatus of claim 2, wherein:
said generating means generates each of said first tone, said third tone, and said additional tones independently of one another during different time intervals; and
said processing means enables said first volume level of said first tone, said second volume level of said third tone, and said volume levels of said additional tones to each be adjusted independently of one another by said user during said different time intervals.

4. The electronic apparatus of claim 1, wherein said generating means generates an audible click each time said first volume level is adjusted upwardly or downwardly by said user.

5. The electronic apparatus of claim 1, wherein said electronic apparatus does not include a display screen.

6. The electronic apparatus of claim 1, wherein said electronic apparatus includes a display screen but does not provide a visual output via said display screen while said generating means generates said first tone and said processing means enables said user to adjust said first volume level.

7. The electronic apparatus of claim 1, wherein said electronic apparatus is an MP3 audio player.

8. The electronic apparatus of claim 1, wherein said control button can be pressed and rotated, said first and second commands are generated by pressing said control button and said processing means enables a user to adjust said first and second volume levels in response to said user rotating said control button.

9. A method for providing an equalizer interface for an electronic apparatus, comprising steps of:
selecting a first one of a plurality of tones corresponding to different frequency bands in response to a first user command, wherein said plurality of tones are selected in a predefined sequential manner, such that if another occurrence of said first user command immediately after said first user command is received, a second tone, which is the immediately next tone in sequence, is selected;
generating said first tone;
enabling a user to adjust a first volume level of said first tone;
storing said first volume level for said first frequency band;
selecting a third tone responsive to a second user command immediately after said first user command, wherein said third tone is a tone in sequence after said second tone;
generating said third tone;
enabling said user to adjust a second volume level of said third tone;
storing said second volume level; and
applying said stored first and second volume levels respectively to output signals in said first and third frequency bands respectively corresponding to said first and third tone,
wherein said electronic apparatus does not provide a visual output representative of the frequency bands.

10. The method of claim 9, further comprising steps of:
generating a plurality of additional tones for a corresponding plurality of additional frequency bands;
enabling said user to adjust volume levels of said additional tones;
storing said volume levels for said additional frequency bands; and
applying said volume levels to output signals in said additional frequency bands.

11. The method of claim 10, wherein:
said first tone, said third tone, and said additional tones are each generated independently of one another during different time intervals; and
said first volume level of said first tone, said second volume level of said third tone, and said volume levels of said additional tones are each adjusted independently of one another by said user during said different time intervals.

12. The method of claim 9, further comprised of generating an audible click each time said first volume level is adjusted upwardly or downwardly by said user.

13. The method of claim 9, wherein said electronic apparatus does not include a display screen.

14. The method of claim 9, wherein said electronic apparatus includes a display screen but does not provide a visual output via said display screen during said generating and enabling steps.

15. A television signal receiver having an adjustment mode and a normal operating mode, comprising:
a control button for a user to provide a first command to select a first one of a plurality of tones corresponding to different frequency bands, wherein said plurality of tones are selected in a predefined sequential manner, such that if another occurrence of said first command is provided immediately after said first command, a second tone, which is the immediately next tone in sequence, is selected, and said control button also allows a user to provide a second command, such that if a second command is received immediately after said first command, a third tone, which is a tone in sequence after said second tone, is selected;
a sound generator operative to generate said first and third tones respectively responsive to said first and second commands in said adjustment mode;
a processor operative to place said receiver in one of said adjustment mode and said normal operating mode responsive to a mode signal in said adjustment mode and to enable a user to adjust a first volume level of said first tone and a second volume level of said third tone;
a memory operative to store said first and second volume levels respectively for first and third frequency bands respectively corresponding to said first and third tones; and
a volume controller having first and second filters for receiving signals from said sound generator in said adjustment mode or from a sound player in said normal operating mode, said volume controller respectively applying said first and second volume levels stored in said memory to output signals from said first and second filters,
wherein said television signal receiver does not provide a visual output representative of the frequency bands.

16. The television signal receiver of claim 15, wherein:
said sound generator generates a plurality of additional tones for a corresponding plurality of additional frequency bands;
said processor enables said user to adjust volume levels of said additional tones;
said memory stores said volume levels for said additional frequency bands; and
said volume controller applies said volume levels to output signals from corresponding filters in said additional frequency bands.

17. The television signal receiver of claim 16, wherein:
said sound generator generates each of said first tone, said third tone, and said additional tones independently of one another during different time intervals; and said processor enables said first volume level of said first tone, said second volume level of said third tone, and said volume levels of said additional tones to each be adjusted independently of one another by said user during said different time intervals.

18. The television signal receiver of claim 15, wherein said sound generator generates an audible click each time said first volume level is adjusted upwardly or downwardly by said user.

19. The television signal receiver of claim 15, wherein said television signal receiver includes a display screen but does not provide a visual output via said display screen while said sound generator generates said first tone and said processor enables said user to adjust said first volume level.

* * * * *